United States Patent [19]

Cammerer et al.

[11] Patent Number: 5,043,024

[45] Date of Patent: Aug. 27, 1991

[54] SOLAR CELL DEVICE

[75] Inventors: Fritz Cammerer; Klaus Bednorz, both of Munich; Manfred Riermeier, Oberneuching, all of Fed. Rep. of Germany

[73] Assignee: Siemens Aktiengesellschaft, Munich, Fed. Rep. of Germany

[21] Appl. No.: 446,789

[22] Filed: Dec. 6, 1989

[30] Foreign Application Priority Data

Dec. 12, 1988 [EP] European Pat. Off. ......... 88120736

[51] Int. Cl.⁵ ............................................. H01L 31/05
[52] U.S. Cl. .................................... 136/244; 136/251; 136/256
[58] Field of Search ..................... 136/244, 251, 256

[56] References Cited

U.S. PATENT DOCUMENTS

| 4,040,867 | 8/1977 | Forestieri et al. | 136/244 |
| 4,067,764 | 1/1978 | Walker et al. | 156/267 |
| 4,224,081 | 9/1980 | Kawamura et al. | 136/251 |
| 4,231,807 | 11/1980 | Keeling et al. | 136/251 |
| 4,401,839 | 8/1983 | Pyle | 136/251 |
| 4,433,200 | 2/1984 | Jester et al. | 136/251 |
| 4,537,838 | 8/1985 | Jetter et al. | 429/9 |
| 4,567,316 | 1/1986 | Hollaus et al. | 136/246 |

FOREIGN PATENT DOCUMENTS

| 3129553 | 2/1983 | Fed. Rep. of Germany | 136/244 |
| 8508149 | 7/1985 | Fed. Rep. of Germany | 136/251 |
| 8520407.2 | 11/1985 | Fed. Rep. of Germany | 136/246 |
| 3513910 | 10/1986 | Fed. Rep. of Germany | 136/251 |
| 8511432.4 | 2/1987 | Fed. Rep. of Germany | 136/251 |
| 3611545 | 10/1987 | Fed. Rep. of Germany | 136/251 |

Primary Examiner—Aaron Weisstuch
Attorney, Agent, or Firm—Hill, Van Santen, Steadman & Simpson

[57] ABSTRACT

Solar cell equipment is mounted using clamps of the present invention. The clamps enable a single mounting which may be employed in conjunction with a frame. The clamps provide electrical contact to the solar cell equipment for carrying the solar generated current. Clamps may also be completely insulated from the solar cell equipment. The clamps provide mechanical stabilization for the solar cell equipment.

16 Claims, 3 Drawing Sheets

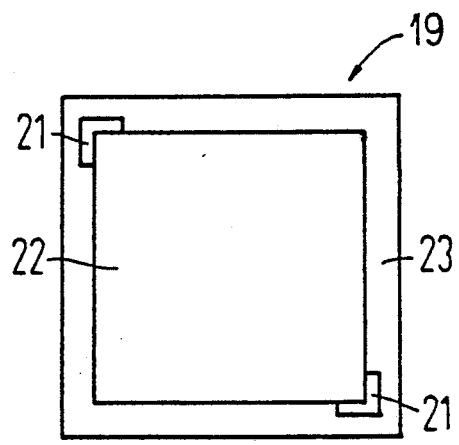
FIG 4
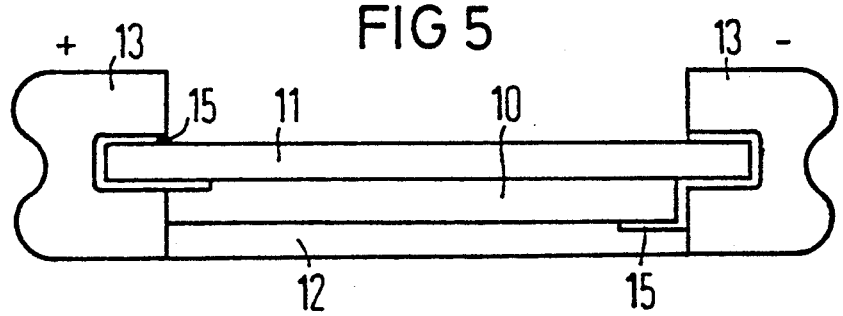
FIG 5
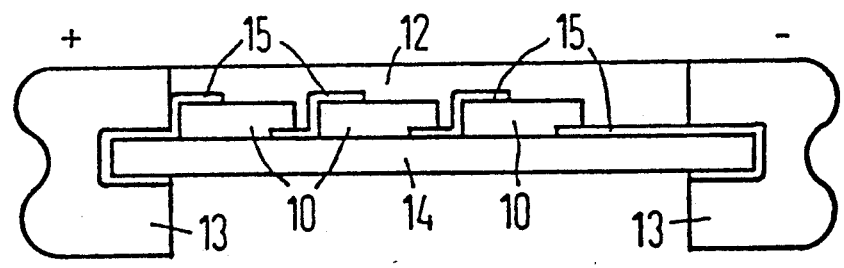
FIG 6
FIG 7A  FIG 7B  FIG 7C
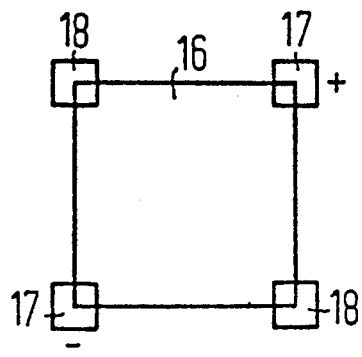 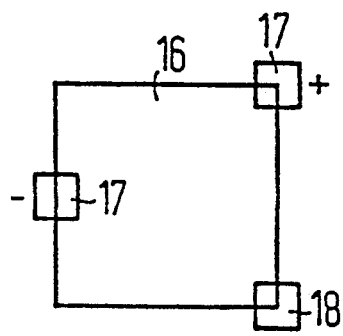 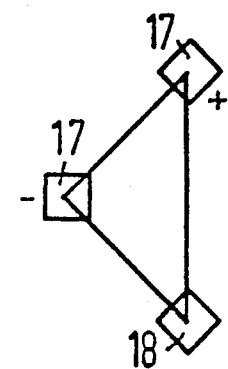

SOLAR CELL DEVICE

BACKGROUND OF THE INVENTION

1. Field of the Invention

The invention relates to solar generators and equipment used for mounting solar cells therein.

2. Description of the Prior Art

Known solar cell equipment usually includes a frame that can serve various purposes such as edge protection, mechanical stability of the solar cell equipment, protection against moisture, as well as local fastening of the solar cell equipment. However, known solar cell equipment that includes a frame, requires considerable outlay for the materials and assembly associated with the frame.

SUMMARY OF THE INVENTION

An object of the present invention is to provide a solar cell equipment that enables a simple assembly, while obviating the need for a complete solar cell frame.

This object is achieved by solar cell equipment constructed in accordance with the principles of the present invention.

In glass technology, clamps are used to fasten balustrade glasses, glass doors, glass facades and similar articles. The clamps of this type can also be used for mounting solar cell equipment in a frameless arrangement. The clamps are used to mount solar cell modules in a frameless fashion. The mounting of solar cell equipment with the assistance of properly designed claws can ensure that no tension or bending occurs within the substrate or superstrate of the solar cell equipment. This clamp mounting is particularly useful for providing mechanical stabilization of the solar cell equipment. Solar cell equipment can also be mechanically stabilized by glass panes or glass fibers incorporated into its structure.

The claws employed for mounting the solar cell equipment can also be used to reduce the outlay required in known solar cell equipment for adaptation to carry solar generated current. The claws employed for mounting the solar cell equipment may also serve as electrical contacts to the solar cell equipment. These claws, designed as electrical contacts, can be electrically connected to at least one solar cell of the solar cell equipment. It is preferred that at least one of the claws, provided for mounting the solar cell equipment, serves as a contact or junction box. Therefore, this claw is designed so that it includes at least one structure for carrying electrical wiring and the acceptance of bypass diodes. Further, this claw or claws provides tension relief of the cabling employed for carrying the current generated in solar cells. Therefore, at least one of the claws can include a cavity for the acceptance of the electrical wiring and/or bypass diodes, and a structure for clamping electrical wiring. The claw or claws can also include an electrical plug or socket. For tension relief, electrical wiring can also be spot-welded to an electrical contact in a claw.

The claws of solar cell equipment of the present invention can be designed with adequately large cross-sections to easily pick up the high electrical currents generated in the solar cell equipment.

The present invention further enables a reduction of the wirings in the interior of the solar cell equipment and field cabling associated with the equipment. With the present invention, individual solar cells or modules can be directly interconnected to one another.

The invention provides a simple structure for parallel and/or series interconnection of solar cell equipment.

Any equipment that includes solar cells that are capable of being provided with claws can be employed as solar cell equipment. For example, all solar modules can be employed in the present invention.

Solar modules that are manufactured in double glass technology can be employed as solar cell equipment. In this type of solar cell, the cell and its electrical wiring are embedded between two glass panes with molten plastic or a thermoplastic foil material.

Solar modules that have been manufactured in superstrate technology can also be employed as solar cell equipment in the invention. In this type of cell, a glass pane is used as a covering for the front side of a solar module, while the backside of the solar module is constructed of plastic or aluminum-coated films. The solar cells and related electrical wiring are embedded between the front side and backside of the solar module with the assistance of thermoplastic films. Methods for manufacturing such solar modules are disclosed in U.S. Pat. Nos. 4,067,764, 4,224,081, 4,231,807, 4,371,739, 4,433,200 and 4,401,839.

The claws for the solar cell equipment can include profiles of aluminum or steel that may be sealed with silicone.

A solar module as disclosed in U.S. Pat. No. 4,567,316 corresponding to European patent No. 0121095, can be used in the invention. In this solar cell module, individual solar cells are arranged in rows and connected in series. Bypass diodes are electrically connected parallel to the individual chains of the solar cells to limit the heating of solar cells that are partially shaded by the sun.

These bypass diodes are integrated directly into the solar cell module, so that an involved junction box is not required only for these bypass diodes. As a result, only two terminals are needed in the solar cell module in the present invention.

Solar cell equipment is mechanically stabilized with glass panes or glass fibers and are provided with claws for carrying current that has been generated in the solar cell equipment.

Solar cell equipment that can operate with a minimum of electrical wiring is employed in the invention. The solar cells can be mechanically stabilized by the substrate or superstrate. The substrate or superstrate includes electrically conductive regions such as metallizations or electrically conductive plastics for electrical connection between individual solar cells and between solar cells and an electrically conductive frame.

The claws can output current from solar cell strings. However, the solar cell equipment may include an individual solar cell. Therefore, a number of claws can be provided to remove current from the solar cells inside the solar cell equipment.

The claws can be composed of metal or an electrically conductive plastic or of a combination thereof. The claws can include a number of poles.

The solar cells can be directly electrically connected to the claws. Also, the solar cells can be provided with electrically conductive straps or wirings for connection to one another or to the claws.

Electrical connections, as required in a solar cell equipment including claws of the invention, can be produced by soldering, welding, clamping, employing electrically conductive adhesive or with any other technique known to a person skilled in the art. Conductive rubber compounds or electrically conductive sealing compounds are also suitable for electrical connection to the claws.

Electrical connections between individual solar cells or between solar cell and claws can be provided by electrically conductive foils, electrically conductive metallizations or with electrically conductive plastic regions on the substrate or superstrate of the solar cell. The solar cells may be connected in series, parallel, or a combination of both. Electrical connections between individual solar cells or between solar cells and claws can be produced by employing known printed circuit board technology.

Known clamp fasteners used in glass construction mountings for fastening partitions, balcony and stair balustrades, can be employed as claws suitable for the present invention. The fastening of such clamps to solar cell equipment can ensue by pinching or through-boring.

DESCRIPTION OF THE DRAWINGS

FIG. 4 shows a plan view of a solar module without clamps attached;

FIG. 5 shows a cross-sectional view of a mounted individual solar cell;

FIG. 6 shows a cross-sectional view of a mounted solar module;

FIGS. 7A, 7B, and 7C respectively show three different arrangements of clamps on a solar module;

DETAILED DESCRIPTION OF THE PREFERRED EMBODIMENTS

Figure 1:
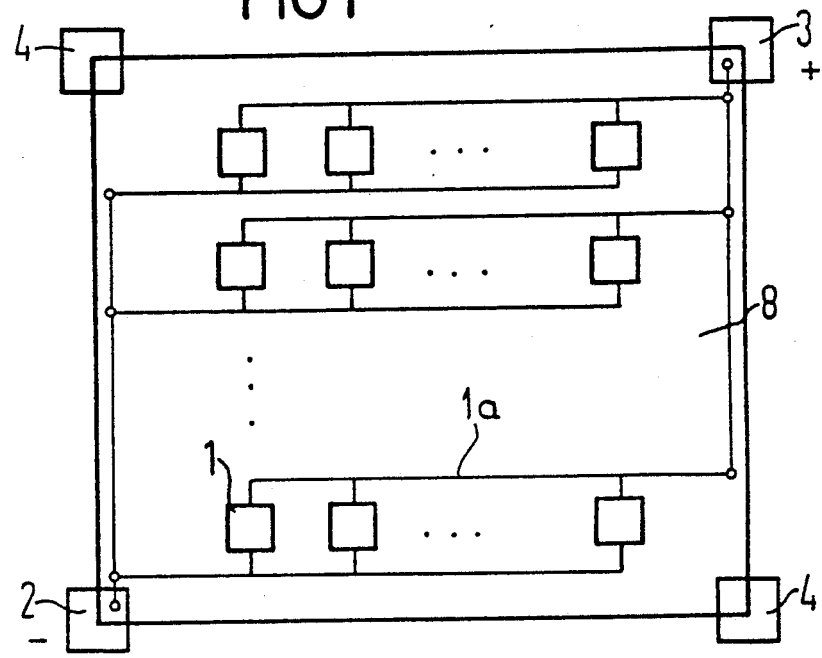
FIG. 1 shows solar cell equipment with claws of the present invention.

FIG. 1 shows solar cell equipment with individual solar cells 1. The claws 2, 3 are electrically conductive and the claws 4 electrically insulated from the claws 2, 3. The solar cells 1 and the claws 2, 3 are interconnected to one another so that the solar cells are connected in parallel with claw 2 forming the negative pole and claw 3 forming the positive pole of the overall solar cell equipment.

The solar cells 1 can thereby be electrically connected to one another with additional electrical wiring 1a. The solar cells, alternatively, may be directly connected to one another by electrically conductive regions on the substrate or superstrate of the solar cell equipment. The solar cells 1 can further be arranged edge-to-edge.

Figure 2:
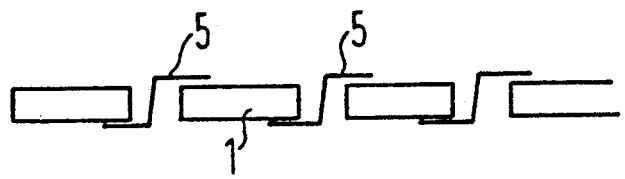
FIG. 2 shows the direct electrical connection of solar cells to each other.

FIG. 2 shows solar cells 1 that are electrically connected to one another in series by electrical conductive members 5 such as straps.

Figure 3:
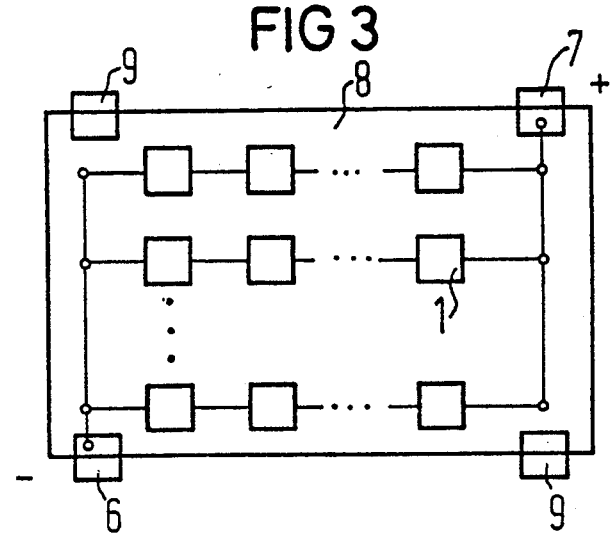
FIG. 3 shows another embodiment of solar cell equipment including claws of the invention.
Figure 8A:
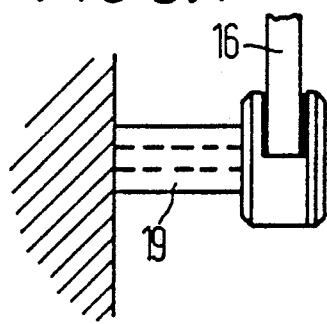
FIGS. 8A, 8B, 8C, and 8D show various clamps that may be employed in the present invention.
Figure 8B:
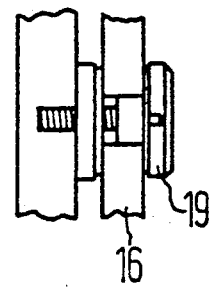
Figure 8C:
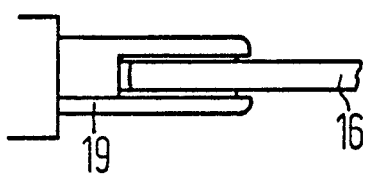
Figure 8D:
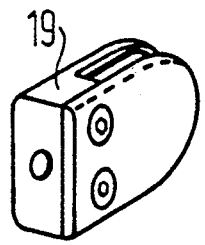

FIG. 3 shows solar cell equipment that includes claws 6, 7, 9 with the solar cells 1 connected in series by row. Solar cell equipment of the invention (see FIGS. 1 and 3) includes a glass pane 8 as a substrate or a superstrate. Entire rows of these serially interconnected solar cells are connected parallel. The solar cell equipment of FIG. 3 has only four claws 6, 7, 8, and 9. Claws 6 forms the negative pole and claw 7 forms the positive pole of the overall arrangement.

Profiled parts that can be continuously cast or extruded can be employed as claws in the present invention.

FIG. 4 shows a plan view of a solar module that may be used for the invention without a frame. The solar cells (not shown in FIG. 4) are covered with a thermoplastic film 22. The solar module 19 has a glass pane 23 as superstrate. The electrical connection between the solar cells of the solar module 19 and the claws to be applied in accord with the invention is achieved by metallized surfaces 21 on the glass 23.

A single solar cell 10 is shown in FIG. 5. A glass pane 11 is employed as superstrate. The glass pane 11 and the solar cell 10 is provided with two claws 13. The two claws 13 are elastically pressed onto the glass pane 11 or placed onto the glass pane 11 and screwed down. The claws may be composed of electrically conductive plastic. The frame parts 13 are directly electrically connected to the solar cell 10 via electrical connections 15. The electrical connections 15 can be electrically conductive films, metallizations, or electrically conductive plastic regions.

FIG. 6 shows a solar module that is constructed similar to the solar cell equipment of FIG. 5. The solar module of FIG. 6 includes a number of solar cells 10. Instead of the glass pane 11, a substrate 14 (circuit board) is provided in FIG. 6. The solar cells 10 in FIGS. 5 and 6 can be covered with plastic 12.

An additional junction box can be eliminated in the solar cell equipment of the invention. Bypass diodes can be directly integrated into the solar cell equipment.

FIGS. 7A, 7B, and 7C show three solar modules 16 with different arrangements of claws 17 as electrical contacts. The claws 18 are electrically insulated with respect to the solar generator voltage. The claws 17 and 18 can be corner claws, as are standard in glass technology.

The solar modules 16 shown in FIGS. 7A, 7B, and 7C can include claws of a type that have a cavity therein or at the surface for accommodating electrical wiring and/or bypass diodes. Electrical wiring can be carried out of the inside of the solar module to a socket. On the edge of a solar module 16, an electrical contact, for example, a metallization 21 as shown in FIG. 4, may be provided. When a claw has a U-shaped profile for the acceptance of the solar module 16, an electrical contact is provided on the inner surface of the U-shaped profile for an electrical connection with the electrically conductive surface 21. A socket or an electrical cable can be provided out of the claw to connect the claw to external devices. The claw can be completely composed of electrically conductive material or electrically conductive material only insofar as required for producing an electrical contact external to the solar cell equipment.

In the invention, at least one claw can serve the function of a conventional junction box.

The claws can be designed to be multi-pole. For example, a voltage of 12 volts can be at one claw while a voltage of 24 volts can be at another claw.

Claws can be secured to the solar cell equipment by either clamping, gluing, or by screwing. For example, a claw of a rail-shaped structure, having a U-shaped profile, can be connected to the solar cell equipment by gluing. A claw having an extruded profile can be employed for gluing a claw to the solar cell equipment. Two, three, four or more claws of the invention can be employed. A claw can be composed of metal, plastic, or a combination thereof.

The invention is particularly useful for frameless solar cell equipment because the outlay for material and additional costs can be eliminated. The claws are particularly suited for holding solar cell equipment. A frame can additionally be present for moisture protection, edge protection, mechanical stabilization of the solar cell equipment, etc.

Solar cell equipment can be screwed onto a support with the assistance of the claws of the present invention in a fashion similar to known solar cell equipment with the assistance of a frame.

FIGS. 8A, 8B, 8C, and 8D show various clamps 19 that are known as glass construction fittings and that are employable as claws within the framework of the invention.

Figure 9:
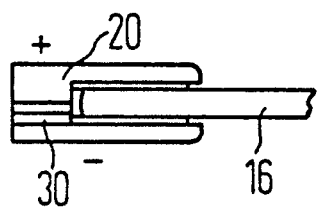
FIG. 9 shows a claw of the present invention clamped onto the solar cell equipment.

FIG. 9 shows a claw 20 that is secured to solar cell equipment 16. The claw 20 has an electrical insulation 30, so that one part of the claw 20 may form a positive pole and one part of the claw may form a negative pole.

Although modifications and changes may be suggested by those skilled in the art, it is the intention of the inventors to embody within the patent warranted hereon, all changes and modifications as reasonably and properly come within their contribution to the art.

We claim as our invention:

1. A solar cell device for generating current, comprising: frameless solar cell means for converting solar energy into electrical current;
   substrate means for supporting said solar cell means disposed directly below and electrically connected to said solar cell means; and
   a plurality of claw means for mounting and mechanically stabilizing said solar cell means and said substrate means attached to at least one edge portion of said substrate means, at least some of said claw means being electrically conductive and thereby additionally serving as means for carrying electrical current generated in said solar cells.

2. A solar cell device as claimed in claim 1, wherein said substrate is glass.

3. A solar cell device as claimed in claim 1, wherein at least one of said claw means is in electrical contact with said substrate.

4. A solar cell device as claimed in claim 1, wherein at least one of said claw means contains a bypass diode.

5. A solar cell device as claimed in claim 1, wherein at least one of said claw means is electrically and mechanically connected to an electrically conductive mounting post.

6. A solar cell device as claimed in claim 1, wherein at least one of said claw means is connected to said substrate to relieve strain on electrical wiring in said solar cell device.

7. A solar cell device as claimed in claim 1, wherein at least one of said claw means is a clamp device connected to said substrate.

8. A solar cell device as claimed in claim 1, wherein at least one of said claw means is connected to said substrate to with an adhesive.

9. A solar cell device for generating current, comprising: frameless solar cell means for converting solar energy into electrical current;
   superstrate means for supporting said solar cell means disposed directly above and electrically connected to said solar cell means; and
   a plurality of claw means for mounting and mechanically stabilizing said solar cell means and said superstrate means attached to at least one edge portion of superstrate means, at least some of said claw means being electrically conductive and thereby additionally serving as means for carrying electrical current generated in said solar cells.

10. A solar cell device as claimed in claim 9, wherein said superstrate is glass.

11. A solar cell device as claimed in claim 9, wherein at least one of said claw means is in electrical contact with said superstrate.

12. A solar cell device as claimed in claim 9, wherein at least one of said claw means contains a bypass diode.

13. A solar cell device as claimed in claim 9, wherein at least one of said claw means is electrically and mechanically connected to an electrically conductive mounting post.

14. A solar cell device as claimed in claim 9, wherein at least one of said claw means is connected to said superstrate to relieve strain on electrical wiring in said solar cell device.

15. A solar cell device as claimed in claim 9, wherein at least one of said claw means is a clamp device connected to said superstrate.

16. A solar cell device as claimed in claim 9, wherein at least one of said claw means is connected to said superstrate with an adhesive.

* * * * *